(12) United States Patent
Kim et al.

(10) Patent No.: US 6,287,905 B2
(45) Date of Patent: Sep. 11, 2001

(54) METHOD FOR FABRICATING SEMICONDUCTOR DEVICE

(75) Inventors: Jeong Ho Kim; Young Seo Kim, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/741,879

(22) Filed: Dec. 22, 2000

(30) Foreign Application Priority Data

Dec. 24, 1999 (KR) .................................................. 99-61849

(51) Int. Cl.[7] ...................... H01L 21/336; H01L 21/8234
(52) U.S. Cl. ............................................. 438/197; 438/284
(58) Field of Search .................................. 438/149, 151, 438/196, 197, 202, 204, 226, 239, 330, 381, 382, 257, 284, 287, 294, 296, 416, 498, 504, 672, 675, 692, 621

(56) References Cited

U.S. PATENT DOCUMENTS 6,124,164 * 9/2000 Al-Shareef et al. ................. 438/240

* cited by examiner

Primary Examiner—David Nelms
Assistant Examiner—David Nhu
(74) Attorney, Agent, or Firm—Pillsbury Winthrop LLP

(57) ABSTRACT

The present invention discloses a method for fabricating a semiconductor device. In a process for forming a bit line contact plug and storage electrode contact plug for the high integration semiconductor device, a MOSFET is formed, a device isolating insulating film protective film is formed at the upper portion of the resultant structure, a sacrificed insulating film pattern is formed at the upper portion of a contact region, an interlayer insulating film is formed and etched according to the CMP process to expose the sacrificed insulating film pattern, the device isolating insulating film protective film formed in the contact region is removed, and a contact plug is formed. That is, the etching process for exposing the contact region is performed on a device isolating insulating film, thereby preventing damage of the semiconductor substrate, improving a contact property, and restricting current leakage due to the damaged device isolating insulating film. Moreover, a margin for the misalignment is increased, and as a result device property and yield are improved.

20 Claims, 6 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and in particular to a method for forming a bit line contact and a storage electrode contact for a high integration device, without damaging a device isolating insulating film and a substrate.

2. Description of the Background Art

Recently, the high integration of a semiconductor device has been remarkably influenced by the development of techniques for forming a fine pattern. In a method for fabricating the semiconductor device, it is essential to miniaturize a photoresist film pattern used as a mask in an etching or ion implantation process.

Resolution (R) of the photoresist film pattern is proportional to a light source wavelength ($\lambda$) and a process variable (k) of a micro exposure device, and inversely proportional to a numerical aperture (NA) of the exposure device.

$$R = k * \lambda / NA$$

Here, in order to improve optical resolution of the micro exposure device, the wavelength of the light source is decreased. For example, resolution of the G-line and I-line micro exposure devices, having wavelengths of 436 nm and 365 nm, respectively, is about 0.7 $\mu$m and 0.5 $\mu$m, respectively. Accordingly, the exposure device using a deep ultraviolet (DUV) light having a small wavelength, for example, a KrF laser of 248 nm or an ArF laser of 193 nm, is employed to form a fine pattern below 0.5 $\mu$m. In addition, in order to improve the resolution, a method for using a phase shift mask as a photo mask has been suggested. A contrast enhancement layer (CEL) method for forming a thin film on a wafer has been suggested for enhancing an image contrast. A tri layer resist (TLR) method has been suggested for positioning an intermediate layer, such as a spin on glass (SOG) film between two photoresist films. And a silylation method has been suggested for selectively implanting a silicon into an upper portion of a photoresist film.

According to the high integration of the semiconductor device, a size of a contact hole, which connects the upper and lower conductive interconnections, and a space between the contact hole and an adjacent interconnection are decreased, and an aspect ratio of the contact hole is increased.

Thus, the high integration semiconductor device having multi-layer conductive interconnections requires precise mask alignment in a contact formation process, thereby reducing a process margin.

In order to maintain a space between the contact holes, masks are formed in consideration: of misalignment tolerance in a mask alignment, lens distortion in an exposure process, critical dimension variations in mask formation and photoetching processes, and mask registration.

In addition, there has been taught a self aligned contact (SAC) method for forming a contact hole according to a self alignment method to overcome a disadvantage of a lithography process.

The SAC method may use a polycrystalline silicon layer, a nitride film or an oxide nitride film as an etching barrier film. In general, the nitride film is employed as the etching barrier film.

Although not illustrated, the conventional SAC method for fabricating the semiconductor device will now be described.

Firstly, a substructure consisting of, for example, a device isolating insulating film, a gate insulating film and a metal-oxide semiconductor field effect transistor (MOSFET) having a gate electrode overlapped with a mask oxide film pattern, and source/drain regions are formed on a semiconductor substrate. An etching barrier film and an interlayer insulating film consisting of an oxide film are sequentially formed over the entire structure.

Thereafter, a photoresist film pattern is formed to expose the interlayer insulating film in a presumed region of a storage electrode contact or bit line contact on the semiconductor substrate.

The interlayer insulating film exposed by the photoresist film pattern is dry-etched to expose the etching barrier film. Then, a contact hole is formed by etching the etching barrier film.

In the conventional SAC method for fabricating the semiconductor device, when the bit line contact and the storage electrode contact for a device below 0.15 $\mu$m are formed, a general circular contact cannot obtain a contact region due to misalignment in the lithography. In order to overcome such a disadvantage, there has been taught a method for forming a conductive layer by etching the oxide film by using the photoresist film pattern for exposing the contact region in a T or I type as an etching mask, and forming a plug by chemical mechanical polishing (CMP) the conductive layer.

The T type mask has a sufficient misalignment margin of the bit line contact. However, the contact hole has a sloped section in the storage electrode contact formation region due to misalignment and the contact oxide film etching process, and thus the contact region is difficult to obtain. Accordingly, this method cannot be applied to a device below 0.13 $\mu$m.

In addition, the I type mask etches the oxide film by shifting a device isolating mask on the device isolating insulating film. Here, an etching area is wider than a mask area, and thus a high selection ratio for a nitride film is hardly obtained.

The etching area has to be much smaller than the non-etching area in order to obtain the high selection ratio for the nitride film in the oxide film etching process. When the etching area is wider than the non-etching area, a polymer cannot sufficiently protect the nitride film.

Moreover, since the etching process using the T type mask or I type mask is performed in the active region of the semiconductor substrate, the active region is exposed to the plasma and damaged in the oxide film etching process, and thus increases a resistance of the contact and a current leakage.

SUMMARY OF THE INVENTION

Therefore, there is a need to provide a method for fabricating a semiconductor device which can form a contact plug by forming a device isolating insulating film protective film at the upper portion of a device isolating insulating film, forming a sacrificed insulating film pattern for exposing the device isolating insulating film in an I type for insulation between contact plugs, filling the exposed portion by forming an interlayer insulating film for insulating devices, removing the sacrificed insulating film pattern, and forming a conductive layer in the region where the sacrificed insulating film has been removed.

Accordingly, the present invention provides a method for fabricating a semiconductor device, the method including: forming a device isolating insulating film for defining an active region on a semiconductor substrate; forming a gate insulating film at the upper portion of the resultant structure;

forming a gate electrode overlapped with a mask insulating film pattern at the upper portion of the gate insulating film; forming insulating film spacers at the side walls of the gate electrode and the mask insulating film pattern; forming source/drain regions on the semiconductor substrate at both sides of the insulating film spacers; forming a device isolating insulating film protective film at the upper portion of the resultant structure; forming a sacrificed insulating film at the upper portion of the resultant structure; forming an I type photoresist film pattern for protecting the presumed portion of a bit line contact and a storage electrode contact at the upper portion of the sacrificed insulating film; forming a sacrificed insulating film pattern by etching the sacrificed insulating film by using the I type photoresist film pattern as an etching mask; forming an interlayer insulating film at the upper portion of the resultant structure; forming an interlayer insulating film pattern filled between the sacrificed insulating film patterns, by etching the interlayer insulating film; exposing the device isolating insulating film protective film, by removing the sacrificed insulating film pattern by using an etching selection ratio difference from the interlayer insulating film pattern; exposing a contact region of the semiconductor substrate, by removing the device isolating insulating film protective film by using the etching selection ratio difference from the interlayer insulating film pattern; forming a conductive layer at the upper portion of the resultant structure; and forming a contact plug by removing the conductive layer and the interlayer insulating film pattern according to a chemical mechanical polishing process employing the mask insulating film pattern as an etching barrier.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for fabricating a semiconductor device in accordance with the present invention will now be described in detail with reference to the accompanying drawings.

Figure 1:
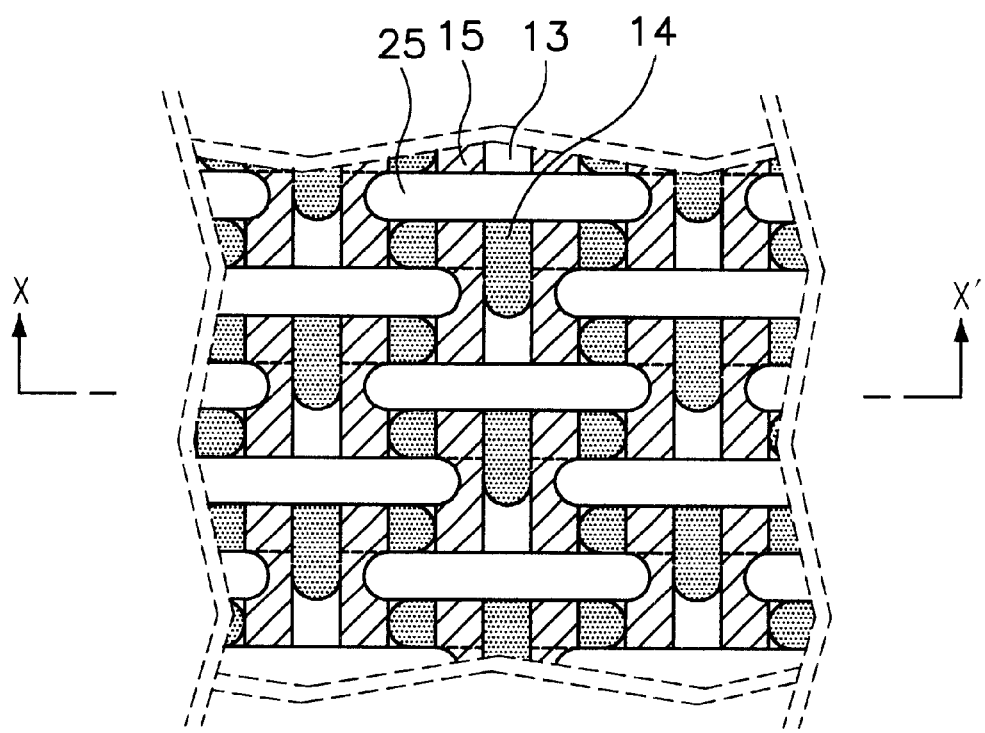
FIG. 1 is a layout diagram of a semiconductor device in accordance with the present invention.

FIG. 1 is a layout diagram of the semiconductor device in accordance with an exemplary embodiment. A device isolating insulating film 13, active region 14 and gate electrode 15 are formed. In addition, an I type photoresist film pattern 25 for exposing the whole region in an I type, except a presumed contact region, is formed. Here, a portion indicated by the I type photoresist film pattern 25 is exposed. A sacrificed insulating film is etched therein.

FIGS. 2A through 2I are cross-sectional diagrams of FIG. 1, taken along line X–X' illustrating sequential steps of a method for fabricating the semiconductor device.

Figure 2A:
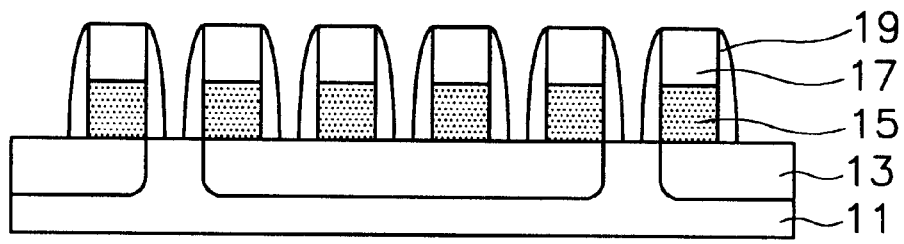
FIGS. 2A through 2I are cross-sectional diagrams illustrating sequential steps of a method for fabricating the semiconductor device, taken along line X–X' in FIG. 1.

As illustrated in FIG. 2A, the device isolating insulating film 13 is formed in a presumed device isolating region on a semiconductor substrate 11.

A gate insulating film (not shown) is formed at the upper portion of the resultant structure, and a stacked structure of a gate electrode conductive layer (not shown) and a mask insulating film (not shown) is formed at the upper portion of the gate insulating film.

The gate electrode 15 and the mask insulating film pattern 17 are formed by etching the stacked structure by using a gate electrode mask as an etching mask. Here, the mask insulating film pattern 17 comprises at least one of SiN film, SiON film and an SRON film containing a large amount of Si (hereinafter, referred to as 'SRON film'). The etching process is performed by using a mixed gas of $CF_4$, $O_2$ and Ar or a mixed gas of $CHF_3$, $O_2$ and Ar, thereby forming the etching surface in a vertical shape.

Thereafter, an insulating film is formed at the upper portion of the resultant structure. Insulating film spacers 19 are formed at the sidewalls of the gate electrode 15 and the mask insulating film pattern 17 by etching the insulating film. The insulating film spacers 19 may comprise an SiN film.

Although not illustrated, a lightly-doped impurity is ion-implanted into the semiconductor substrate 11 at both sides of the insulating film spacers 19, thereby forming source/drain regions(not shown).

Figure 2B:
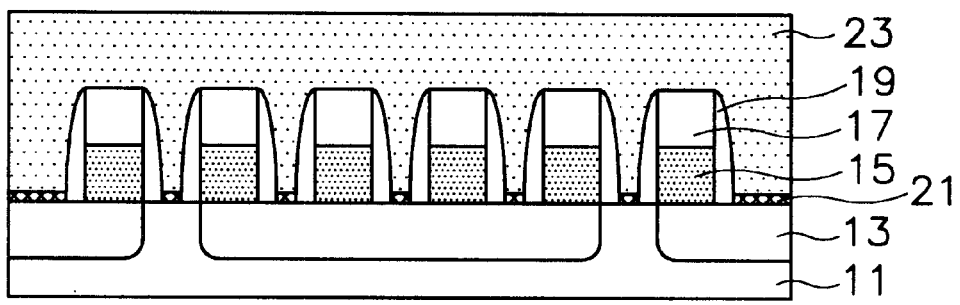

Referring to FIG. 2B, a device isolating insulating film protective film 21, having a predetermined thickness, is formed at the upper portion of the resultant structure. Here, the device isolating insulating film protective film 21 is selected from the group consisting of SiN film, SiON film, $Al_2O_3$ film, $Ta_2O_5$ film, SiOCH film or SiCH film so that the device isolating insulating film cannot be damaged in the etching process for forming a contact hole.

A sacrificed insulating film 23 is formed at the upper portion of the resultant structure. The sacrificed insulating film 23 comprises a doped oxide film having an etching selection ratio difference from the device isolating insulating film protective film 21, such as a PSG film, BPSG film or advanced planarization layer (APL).

Figure 2C:
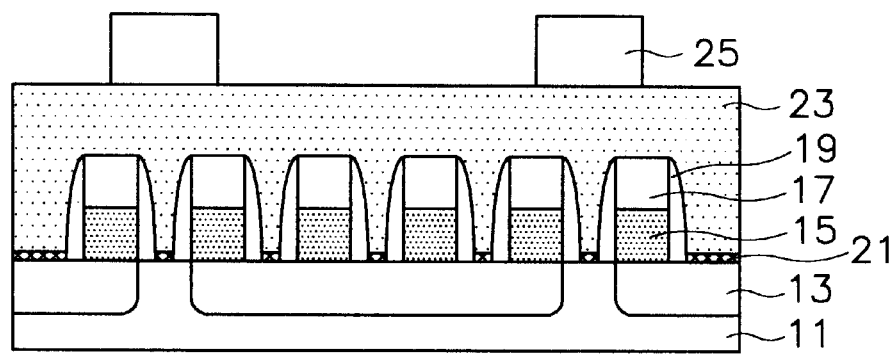

As shown in FIG. 2C, the I type photoresist film pattern 25 for exposing the whole region in an I type, except the presumed contact region of the bit line and storage electrode is formed at the upper portion of the sacrificed insulating film 23.

Figure 2D:
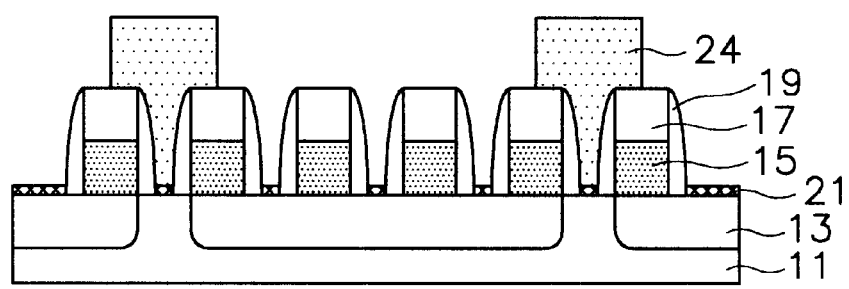

As depicted in FIG. 2D, a sacrificed insulating film pattern 25 for protecting a presumed contact region is formed, by etching the sacrificed insulating film 23 using the I type photoresist film pattern 25 as an etching mask.

The sacrificed insulating film 23 may be etched by employing a perfluorocarbon containing gas producing a large amount of polymers, the gas being selected from the group consisting of $C_2F_6$, $C_2F_4$, $C_3F_6$, $C_3F_8$, $C_4F_6$, $C_4F_8$, $C_5F_8$, $C_5F_{10}$ or $C_2HF_5$, or a mixed gas of the perfluorocarbon containing gas and a hydrogen containing gas such as $CHF_3$, $CH_3F$, $CH_2F_2$, $CH_2$, $CH_4$, $C_2H_4$ and $H_2$. In addition, the etching process may be performed by adding an inert gas such as He, Ne, Ar or Xe into the perfluorocarbon containing gas and the mixed gas. As a result, the plasma stability and sputtering effects are improved, and thus the etch stop phenomenon is overcome, thereby performing a reproducible etching process. The etching process may be performed by using CxHyFz gas ($X \geq 2$, $y \geq 2$, $z \geq 2$) as an etching gas, to thereby obtain a high selection ratio in regard to the mask insulating film pattern 17 and the insulating film spacer 19. The etching process may be carried out by employing a mixed gas as an etching gas, the mixed gas comprising the CxHyFz gas ($X \geq 2$, $y \geq 2$, $z \geq 2$) and the inert gas.

Thereafter, the I type photoresist film pattern 25 is removed.

Figure 2E:
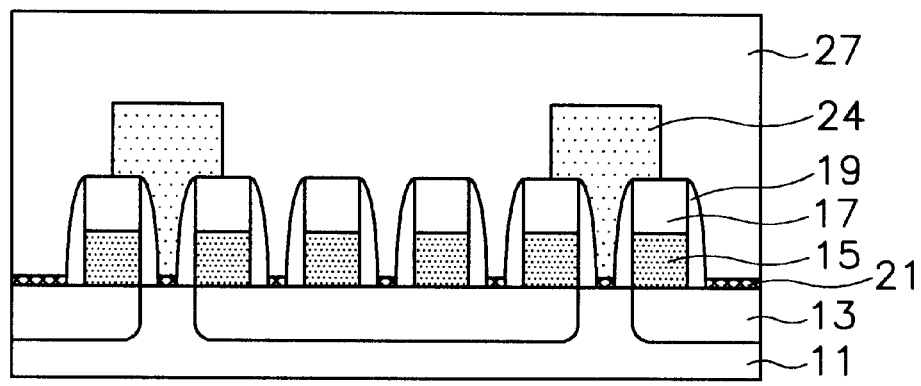

As illustrated in FIG. 2E, an interlayer insulating film 27 for isolating devices is formed at the upper portion of the resultant structure. In order to have the etching selection ratio difference from the sacrificed insulating film pattern 24, the interlayer insulating film 27 is selected from the group consisting of an undoped oxide film (such as, e.g., a low temperature oxide film, middle temperature oxide film, high temperature oxide film, tetra ethyl ortho silicate glass (TEOS) oxide film or high density plasma), undoped silicate glass (USG) film, an SiN film, and an SiON film, and combinations thereof.

Figure 2F:
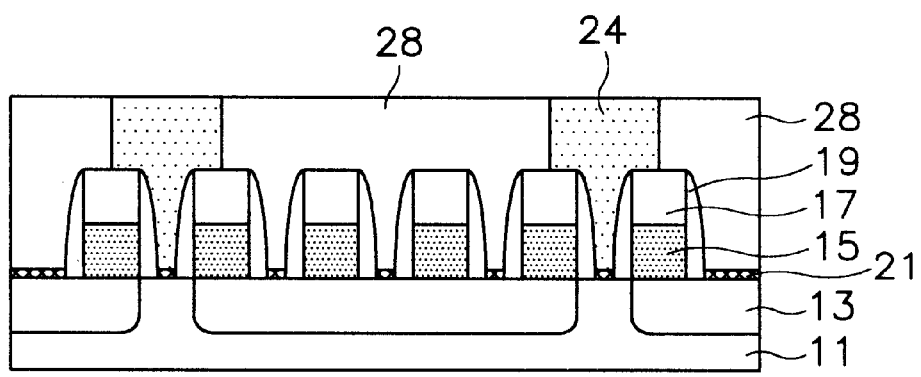

As depicted in FIG. 2F, the interlayer insulating film 27 is etched according to a chemical mechanical polishing (CMP) process or whole surface etching process. The sacrificed insulating film pattern 24 is used as an etching barrier.

Figure 2G:
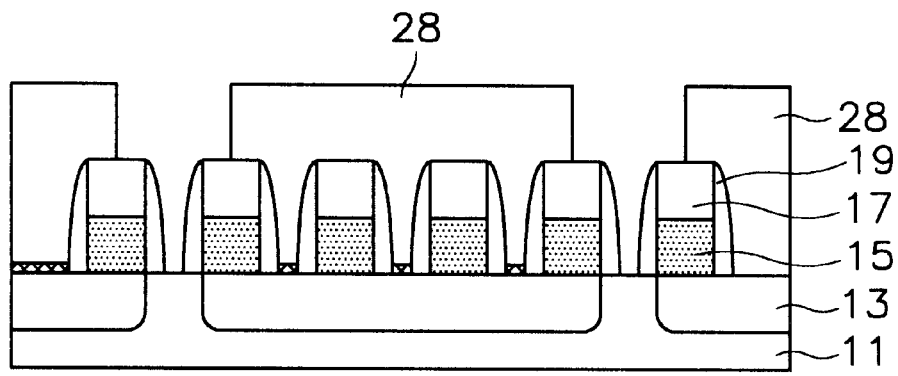

Referring to FIG. 2G, the sacrificed insulating film pattern 24 is etched by using the etching selection ratio difference between the sacrificed insulating film pattern 24 and the interlayer insulating film pattern 28. The etching process is a wet etching process using a mixed solution of HF and deionized water, or a mixed solution of $NH_4OH$, HF and deionized water. In addition, the etching process may be an isotropic dry etching process using a mixed gas as an etching gas, the mixed gas comprising a main etching gas (such as $CF_4$, $SF_6$, $NF_3$ or $C_2F_6$), an oxygen containing gas (such as $O_2$, $CO_2$, CO or $SO_2$), and an inert gas (such as He, Ne, Ar or Xe).

Thereafter, the device isolating insulating film protective film 21 exposed to the interlayer insulating film pattern 28 is removed by using a mixed gas of the main etching gas (such as $CF_4$, $SF_6$, $NF_3$ or $C_2F_6$), the oxygen containing gas (such as $O_2$, $CO_2$, CO or $SO_2$), and the inert gas (such as He, Ne, Ar or Xe), and by using a low bias power. Accordingly, a damage on the semiconductor substrate 11 is minimized.

Figure 2H:
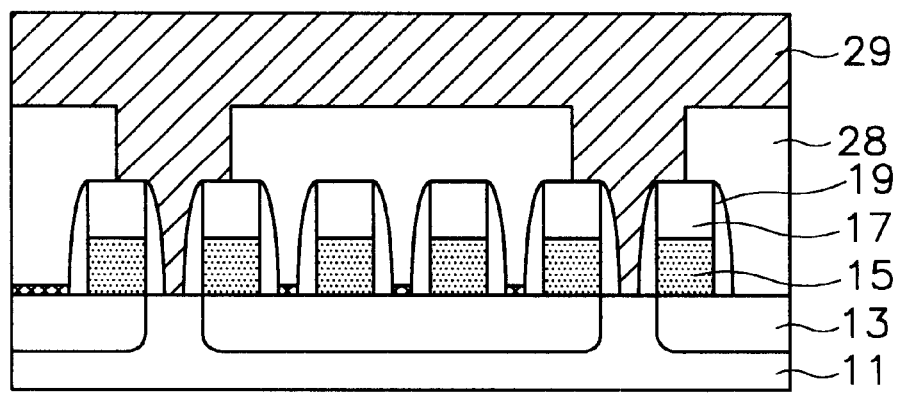

As illustrated in FIG. 2H, a conductive layer 29 is formed at the upper portion of the resultant structure. The conductive layer 29 comprises a polysilicon layer, a tungsten film, a selectively-formed tungsten film or a silicon layer formed according to a selective epitaxial growth (SEG) method.

Figure 2I:
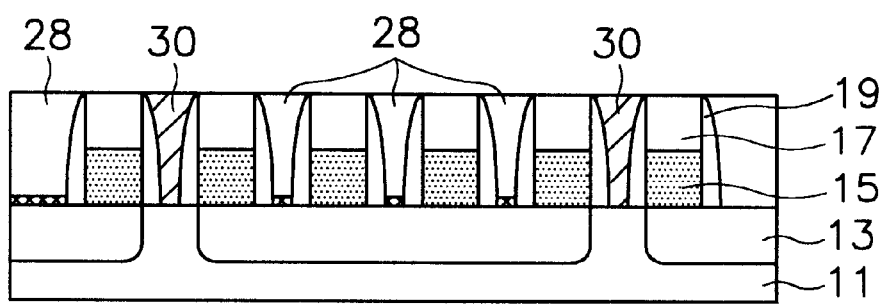

As depicted in FIG. 2I, a contact plug 30 is formed by removing the conductive layer 29 and the interlayer insulating film pattern 28 according to the CMP process so that the mask insulating film pattern 17 can be exposed. Here, when the conductive layer 29 comprises the selectively-formed tungsten film or the silicon layer formed according to the SEG method, the CMP process can be skipped.

As discussed earlier, in accordance with the present invention, in the process for forming the bit line contact plug and storage electrode contact plug for the high integration semiconductor device, the MOSFET is formed, the device isolating insulating film protective film is formed at the upper portion of the resultant structure, the sacrificed insulating film pattern is formed at the upper portion of the contact region, the interlayer insulating film is formed and etched according to the CMP process to expose the sacrificed insulating film pattern, the device isolating insulating film protective film formed in the contact region is removed, and the contact plug is formed. That is, the etching process for exposing the contact region is performed on the device isolating insulating film, thereby preventing damage of the semiconductor substrate, improving the contact property, and restricting current leakage due to the damaged device isolating insulating film. Moreover, a margin for the misalignment is increased, and thus the device property and yield are improved.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for fabricating a semiconductor device, the method comprising:

forming a device isolating insulating film for defining an active region on a semiconductor substrate;

forming a gate insulating film at the upper portion of the resultant structure;

forming a gate electrode overlapped with a mask insulating film pattern at the upper portion of the gate insulating film;

forming insulating film spacers at the side walls of the gate electrode and the mask insulating film pattern;

forming source/drain regions on the semiconductor substrate at both sides of the insulating film spacers;

forming a device isolating insulating film protective film at the upper portion of the resultant structure;

forming a sacrificed insulating film at the upper portion of the resultant structure;

forming a photoresist film pattern for exposing the whole region in an I type, except the presumed portion of a bit line contact and a storage electrode contact at the upper portion of the sacrificed insulating film;

forming a sacrificed insulating film pattern by etching the sacrificed insulating film by using the photoresist film pattern as an etching mask;

removing the photoresist film pattern;

forming an interlayer insulating film at the upper portion of the resultant structure;

forming an interlayer insulating film pattern filled between the sacrificed insulating film patterns, by etching the interlayer insulating film;

exposing the device isolating insulating film protective film, by removing the sacrificed insulating film pattern by using an etching selection ratio difference from the interlayer insulating film pattern;

exposing a contact region of the semiconductor substrate, by removing the device isolating insulating film protective film by using the etching selection ratio difference from the interlayer insulating film pattern;

forming a conductive layer at the upper portion of the resultant structure; and forming a contact plug by removing the conductive layer and the interlayer insulating film pattern according to a chemical mechanical polishing process employing the mask insulating film pattern as an etching barrier.

2. The method according to claim 1, wherein the mask insulating film pattern is selected from the group consisting of SiN film, SiON film, $Al_2O_3$ film, $Ta_2O_5$ film, SiOCH film, SiCH film, and combinations thereof.

3. The method according to claim 1, wherein the insulating film spacers comprise an SiN film.

4. The method according to claim 1, wherein the device isolating insulating film protective film is formed by using a thin film having an etching selection ratio difference from the device isolating insulating film, and is selected from the group consisting of an SiN film, SiON film, $Al_2O_3$ film, $Ta_2O_5$ film, SiOCH film, SiCH film, and combinations thereof.

5. The method according to claim 1, wherein the sacrificed insulating film comprises a doped oxide film selected from the group consisting of a PSG film, BPSG film, advanced planarization layer (APL), and combinations thereof, which have an etching selection ratio difference from the device isolating insulating film protective film.

6. The method according to claim 1, wherein the sacrificed insulating film is etched by employing a perfluorocarbon containing gas causing a large amount of polymers, the perfluorocarbon containing gas and being selected from the group consisting of $C_2F_6$, $C_2F_4$, $C_3F_6$, $C_3F_8$, $C_4F_6$, $C_4F_8$, $C_5F_8$, $C_5F_{10}$, $C_2HF_5$, and combinations thereof, in order to have a high selection ratio in regard to the mask insulating film pattern and the insulating film spacers.

7. The method according to claim 1 or 6, wherein the sacrificed insulating film is etched by using a mixed gas of the perfluorocarbon containing gas and an inert gas as an etching gas.

8. The method according to claim 1 or 6, wherein the sacrificed insulating film is etched by using a mixed gas as an etching gas, the mixed gas comprising of the perfluorocarbon containing gas and a hydrogen containing gas.

9. The method according to claim 8, wherein the hydrogen containing gas is selected from the group consisting of $CHF_3$, $CH_3F$, $CH_2F_2$, $CH_2$, $CH_4$, $C_2H_4$, $H_2$, and combinations thereof.

10. The method according to claim 8, wherein the sacrificed insulating film is etched by using a as an etching gas, the gas mixture comprising the mixed gas and an inert gas.

11. The method according to claim 1, wherein the sacrificed insulating film is etched by using CxHyFz gas ($X \geq 2$, $y \geq 2$, $z \geq 2$) as an etching gas, to obtain a high selection ratio in regard to the mask insulating film pattern and the insulating film spacer.

12. The method according to claim 11, wherein the sacrificed insulating film is etched by using a mixed gas as an etching gas, the mixed gas comprising the CxHyFz gas ($X \geq 2$, $y \geq 2$, $z \geq 2$) and an inert gas.

13. The method according to claim 1, wherein the interlayer insulating film is selected from the group consisting of an undoped oxide film, undoped silicate glass (USG) film, an SiN film, an SiON film, and combinations thereof, which have an etching selection ratio to the sacrificed insulating film.

14. The method according to claim 13, wherein the undoped oxide film comprises at least one of 2 low temperatureoxide film, 2 middle temperature oxide film, a high temperature oxide film, a tetraethylortho silicate glass (TEOS) oxide film, and a high density plasma.

15. The method according to claim 1, wherein the sacrificed insulating film pattern is removed according to a wet etching process using a mixed solution as an etchant, the mixed solution comprising HF and deionized water.

16. The method according to claim 1, wherein the sacrificed insulating film patterns is removed according to a wet etching process using a mixed solution as an etchant, the mixed solution comprising $NH_4OH$, HF and deionized water.

17. The method according to claim 1, wherein the sacrificed insulating film pattern is removed according to an isotropic dry etching process using a mixed gas as an etching gas, the mixed gas comprising a main etching gas selected from the group consisting of $CF_4$, $SF_6$, $NF_3$, $C_2F_6$ and combinations thereof, an oxygen containing gas and an inert gas.

18. The method according to claim 1, wherein the device isolating insulating film protective film is removed by using a mixed gas as an etching gas, the mixed gas comprising a main etching gas selected from the group consisting of $CF_4$, $SF_6$, $NF_3$, $C_2F_6$ and combinations thereof, an oxygen containing gas and an inert gas.

19. The method according to claim 1, wherein the conductive layer comprises at least one of a polysilicon layer, a tungsten film, a selectively-formed tungsten film and a silicon layer formed according to a selective epitaxial growth method.

20. The method according to claim 1 or 19, wherein a succeeding chemical mechanical polishing process is skipped when the conductive layer comprises at least one of the selectively-formed tungsten film and the silicon layer formed according to the selective epitaxial growth method.

* * * * *